US008076695B2

(12) United States Patent
Nishimura (10) Patent No.: US 8,076,695 B2
(45) Date of Patent: Dec. 13, 2011

(54) SEMICONDUCTOR DEVICE (75) Inventor: Kenichi Nishimura, Kyoto (JP)

(73) Assignee: Panasonic Corporation, Osaka (JP)

( * ) Notice: Subject to any disclaimer, the term of this patent is extended or adjusted under 35 U.S.C. 154(b) by 120 days.

(21) Appl. No.: 12/570,496

(22) Filed: Sep. 30, 2009

(65) Prior Publication Data

US 2010/0078677 A1 Apr. 1, 2010

(30) Foreign Application Priority Data

Sep. 30, 2008 (JP) ................................. 2008-254050

(51) Int. Cl.
*H01L 29/06* (2006.01)
(52) U.S. Cl. ................. 257/170; 257/487; 257/E29.012
(58) Field of Classification Search .................. 258/170, 258/487, E29.012
See application file for complete search history.

(56) References Cited

U.S. PATENT DOCUMENTS

| | | | | |
|---|---|---|---|---|
| 5,473,169 A * | 12/1995 | Ker et al. | ....................... | 257/173 |
| 5,838,050 A * | 11/1998 | Ker et al. | ....................... | 257/401 |
| 6,291,114 B1 * | 9/2001 | Reijers | ............................... | 430/5 |
| 6,855,970 B2 * | 2/2005 | Hatakeyama et al. | ........ | 257/264 |
| 6,927,345 B2 * | 8/2005 | Wu et al. | ........................ | 174/255 |
| 7,105,927 B2 * | 9/2006 | Lee | ............................... | 257/773 |
| 7,238,991 B2 * | 7/2007 | Kuroda et al. | .................. | 257/355 |
| 7,274,077 B2 * | 9/2007 | Henninger et al. | ............ | 257/409 |
| 7,675,127 B1 * | 3/2010 | Worley | .......................... | 257/409 |
| 7,709,931 B2 * | 5/2010 | Torii | ............................... | 257/586 |
| 2007/0228505 A1 * | 10/2007 | Mazzola et al. | ............... | 257/471 |
| 2008/0029838 A1 * | 2/2008 | Zhang et al. | ................... | 257/475 |
| 2008/0179624 A1 * | 7/2008 | Russ et al. | ..................... | 257/173 |

FOREIGN PATENT DOCUMENTS

| | | |
|---|---|---|
| JP | 2005-183605 A | 7/2005 |
| JP | 2008-130622 A | 6/2008 |

* cited by examiner

*Primary Examiner* — N Drew Richards
*Assistant Examiner* — Robert Carpenter
(74) *Attorney, Agent, or Firm* — McDermott Will & Emery LLP (57) ABSTRACT

A semiconductor device comprises a semiconductor substrate having a first semiconductor region of a first semiconductor type, a second semiconductor region of a second conductivity type extended in the first semiconductor region, and a mesa area forming a slope along an outer circumference of the semiconductor substrate; a first electrode provided on a first principal surface of the semiconductor substrate; and a second electrode provided on a second principal surface of the semiconductor substrate that is opposed to the first principal surface; wherein the second semiconductor region comprises a main region provided in the semiconductor substrate while being brought into contact with the first electrode, the main region including an annular portion and diffused portions arranged in a spread manner in an area surrounded by the annular portion; and wherein a portion of the first semiconductor region is interposed between the diffused portions and between the diffused portions and the annular portion; and the diffused portions are composed of a small pitch region and a large pitch region having a larger pitch than that of the small pitch region.

8 Claims, 11 Drawing Sheets

SEMICONDUCTOR DEVICE

BACKGROUND OF THE INVENTION

1. Field of the Invention

The present invention relates to a semiconductor device and, more particularly, to an increase in withstand capacity for static breakdown due to ESD (electrostatic discharge).

2. Description of the Related Art

A device that uses a guard ring having a multiple structure has hitherto been proposed as a high withstand voltage device (see; for instance, Patent Document 1). In Patent Document 1, a semiconductor film made of silicon containing n-type impurities is formed, by means of epitaxial growth, on a semiconductor substrate made of silicon containing n-type impurities. An n-type intermediate concentration layer, an n-type low concentration layer, a $p^-$-type active region, guard rings formed in a multi-structure, a $p^+$-type active region, and an $n^+$-type channel stopper region are formed in the semiconductor film.

By means of the structure, when the device is activated, the outermost guard ring serves as a point for originating the maximum electric charge. However, multiple numbers of guard rings are present and electrically stable while protected by a silicon oxide film. Hence, comparatively heavy load is imposed on intermediate guard rings, thereby reducing field intensity. Thus, a withstand voltage structure is realized.

Figure 11:
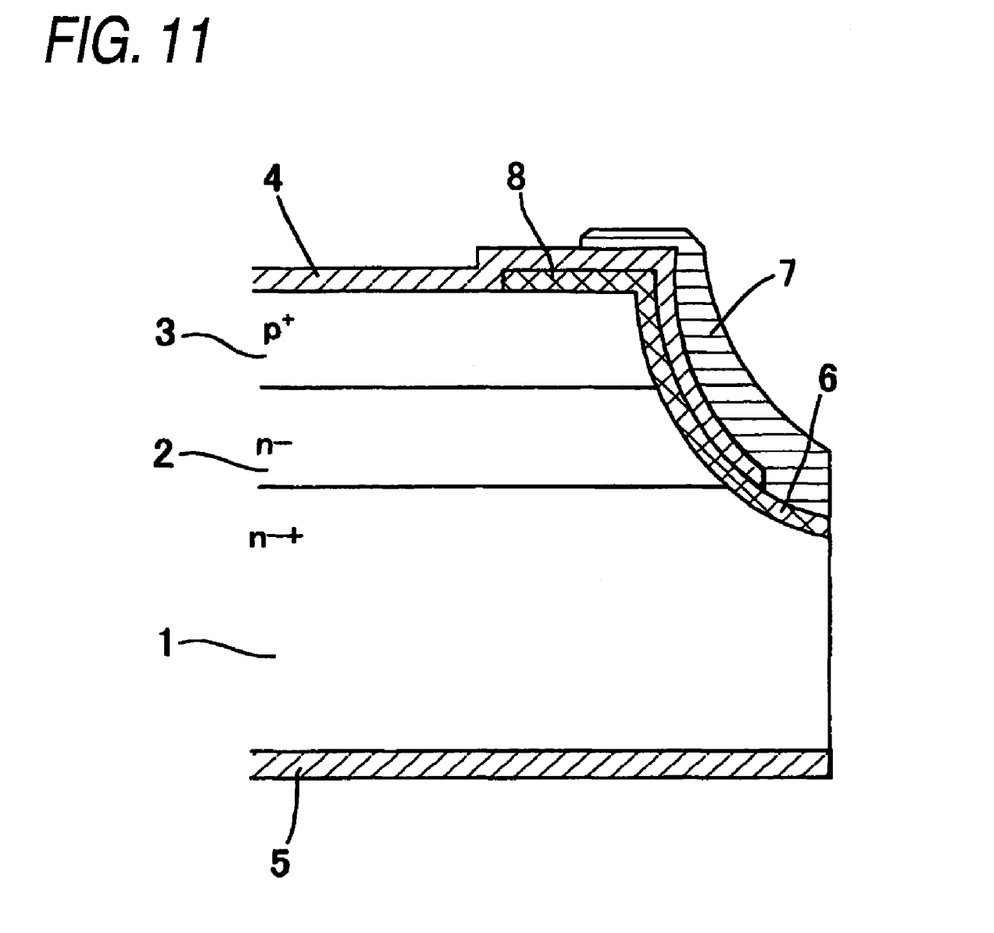
FIG. 11 is a cross-sectional view showing a related-art mesa semiconductor device.

A mesa semiconductor device, such as that shown in FIG. 11, has been known as another high withstand voltage device. In the semiconductor substrate of the mesa semiconductor device, a plurality of semiconductor crystal thin films forming an epitaxial layer are formed over an upper surface of a base layer 1; an n-type semiconductor region 2 made of an n-type semiconductor layer is formed over an upper surface of the base layer 1 made of an n-type semiconductor layer; a p-type semiconductor region 3 made of a p-type semiconductor layer is formed over an upper surface of the n-type semiconductor region 2; and the n-type semiconductor region 2 and the p-type semiconductor region 3 form a p-n junction. An anode electrode 4 is formed over an upper surface of the p-type semiconductor region 3 making up one principal surface of the semiconductor substrate, and a cathode electrode 5 is formed over a lower surface of the base layer 1 forming the other principal surface of the semiconductor substrate. A mesa area 6 making up a concave slope is formed along a circumference of the semiconductor substrate. An oxide film 8, such as $SiO_2$, is provided so as to cover the mesa area 6, and a protective film 7 is provided so as to cover the oxide film 8.
Patent Document 1: JP-A-2005-183605
Patent Document 2: JP-A-2008-130622

Incidentally, in the diode of Patent Document 1, an electric field concentrates on the guard rings when a reverse bias voltage is applied to the diode. An electric field particularly concentrates on corners in the guard rings. Therefore, when a surge current flows through a device, the highest concentration of an electric field arises in the corners of the guard rings, which may cause local breakdown. Thus, the diode does not have sufficient withstand capacity for static breakdown due to an ESD.

Figure 10:
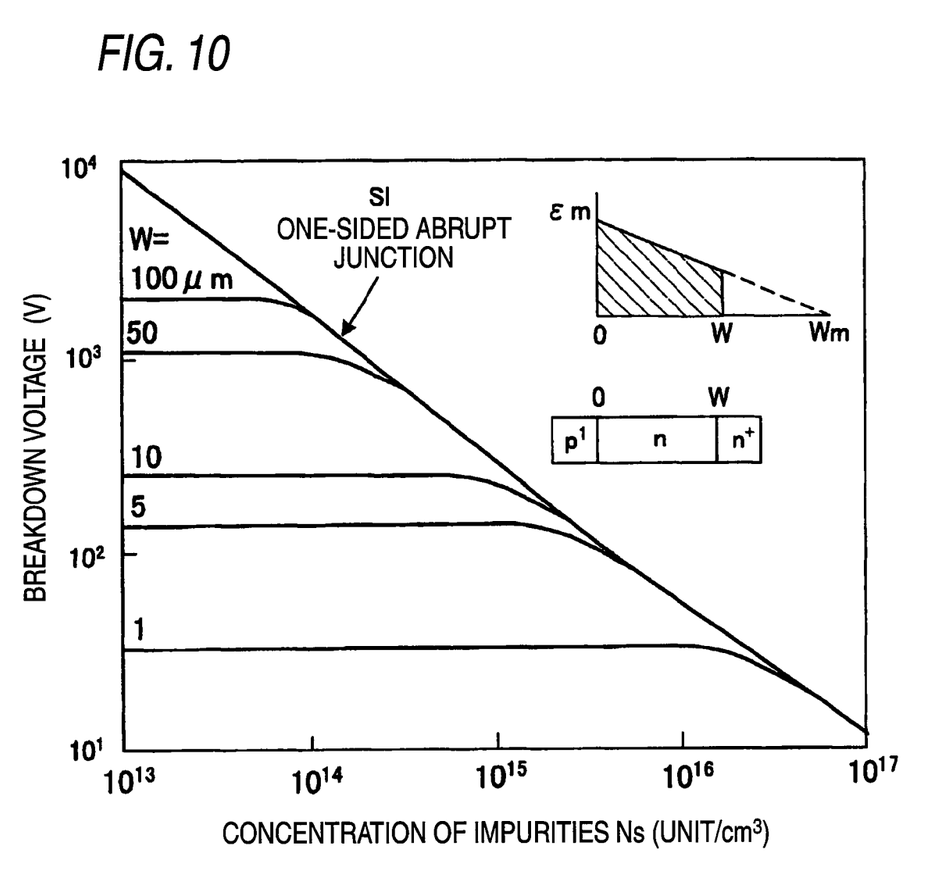
FIG. 10 is a view showing a relationship between the concentration of impurities and a breakdown voltage.

When a reverse bias voltage is applied to the mesa semiconductor device in FIG. 10; i.e., a mesa diode, the p-type semiconductor region 3 made of a p-type semiconductor layer is present over the entire surface of the active region on one principal surface of the semiconductor substrate. Hence, a location where the highest concentration of electric field arises is an area in a mesa area where an end of the p-n junction interface is exposed.

SUMMARY OF THE INVENTION

The present invention aims at providing a semiconductor device capable of enhancing ESD withstand capacity by causing a breakdown in an active region in preference to a mesa area when a reverse bias voltage commensurate with a present withstand voltage value is applied, thereby yielding a stable characteristic and achieving high reliability.

The present invention provides with a semiconductor device, comprising a semiconductor substrate having a first semiconductor region of a first semiconductor type, a second semiconductor region of a second conductivity type extended in the first semiconductor region, and a mesa area forming a slope along an outer circumference of the semiconductor substrate; a first electrode provided on a first principal surface of the semiconductor substrate; and a second electrode provided on a second principal surface of the semiconductor substrate that is opposed to the first principal surface; wherein the second semiconductor region comprises a main region provided in the semiconductor substrate while being brought into contact with the first electrode, the main region including an annular portion and diffused portions arranged in a spread manner in an area surrounded by the annular portion; and wherein a portion of the first semiconductor region is interposed between the diffused portions and between the diffused portions and the annular portion; and the diffused portions are composed of a small pitch region and a large pitch region having a larger pitch than that of the small pitch region.

As mentioned above, according to the present invention, the large pitch regions and the small pitch regions are provided in the diffused portions, whereby at the time of application of a reverse bias voltage concentration of an electric field can be caused in an active region that is located more inside than is a guard ring; namely, an annular portion, without involvement of an increase in the area of a device while a desired forward voltage is maintained. Therefore, local concentration of an electric field can be prevented, and enhancement of ESD can be attempted.

Specifically, a Schottky junction area is sufficiently assured without involvement of an increase in the area of a device. The main region is composed of the annular portion and the diffused portions arranged in a spread manner in the interior area surrounded by the annular portion. The withstand voltage of an active region becomes lower in the diffused portions rather than in the annular portion. An electric field concentrates on the diffused portions of the interior area than on the annular portion at the time of application of the reverse bias voltage. Hence, local destruction, which would otherwise be caused by local concentration of the electric field on the annular portion, can be prevented. As a consequence, a device reliably induces breakdown in the active region surrounded by the annular portion of the main region at the reverse bias voltage, and withstand capacity for static breakdown due to ESD is enhanced.

In the diffused portions, the small pitch regions and the large pitch regions are alternately provided, thereby facilitating generation of a pattern.

Further, the diffused portions are made of a stripe-like pattern, and the large pitch regions and the small pitch regions are alternately arranged, thereby facilitating generation of a pattern.

In the diffused portions, the small pitch regions are arranged in the large pitch regions, thereby facilitating generation of a pattern.

The diffused portions are composed of a stripe-like pattern, and the small pitch regions composed of a small-pitch stripe-like pattern is arranged in the large pitch regions composed of a large-pitch stripe-like pattern, thereby facilitating generation of a pattern.

The second semiconductor region is separated and split into the main region that contacts the first electrode and the sub-region that remains out of contact with the first electrode. Portions of the first semiconductor region are interposed between the main region and the sub-region of the second semiconductor region, whereby the following working-effects are yielded.

When the reverse bias voltage is applied to the first electrode, a depletion layer extends from the main region of the second semiconductor region to the first semiconductor region, whereupon an electric field concentrates on the end of a p-n junction interface of the main region. The depletion layer extends from the main region of the second semiconductor region toward the sub-region with an increase in reverse bias voltage. When the depletion layer reaches the sub-region of the second semiconductor area, a predetermined electric potential develops in the sub-region of the second semiconductor region. However, the predetermined electric potential developing in the sub-region of the second semiconductor region is lower than an electric potential of the main region of the second semiconductor region. Hence, the intensity of an electric field at the end of the p-n junction interface of the sub-region; namely, the intensity of an electric field in the mesa area, becomes smaller, so that the withstand voltage of the mesa area can be enhanced.

The second semiconductor region is composed of the main region contacting the first electrode and the sub-region that remains out of contact with the first electrode. The main region is composed of the annular portion and the diffused portions that are arranged in a spread manner in the interior area surrounded by the annular portion. There can thereby be implemented a highly-reliable device that does not induce breakdown in the mesa area at a reverse bias voltage and that reliably causes breakdown in the active region surrounded by the annular portion of the main region, and withstand capacity for static breakdown due to ESD is enhanced.

Incidentally, when the distance between the main region and the sub-region falls within a range of predetermined value (allowance), a breakdown voltage at which breakdown occurs in the active region remains constant regardless of the distance between the main region and the sub-region. However, when distance between the main region and the sub-region exceeds the predetermined value (allowance), breakdown occurs in the annular portion of the main region; particularly, in corners. A permissible value for distance between the main region and the sub-region required to cause breakdown in the active region varies according to specific resistance of the epitaxial layer making up the first semiconductor region.

Therefore, the distance between the main region and the sub-region and the specific resistance of the epitaxial layer making up the first semiconductor region are set to values required to induce breakdown in the active region at the time of application of a reverse bias voltage commensurate with a preset withstand voltage value. For instance, when distance between the main region and the sub-region is determined by design, the specific resistance of the epitaxial layer is selectively set in such a way that breakdown arises in the active region at predetermined distance. Alternatively, when the specific resistance of the epitaxial layer is determined by design, the distance between the main region and the sub-region is selectively set in such a way that breakdown occurs in the active region at predetermined specific resistance.

DESCRIPTION OF THE PREFERRED EMBODIMENTS

First Embodiment

Figure 1:
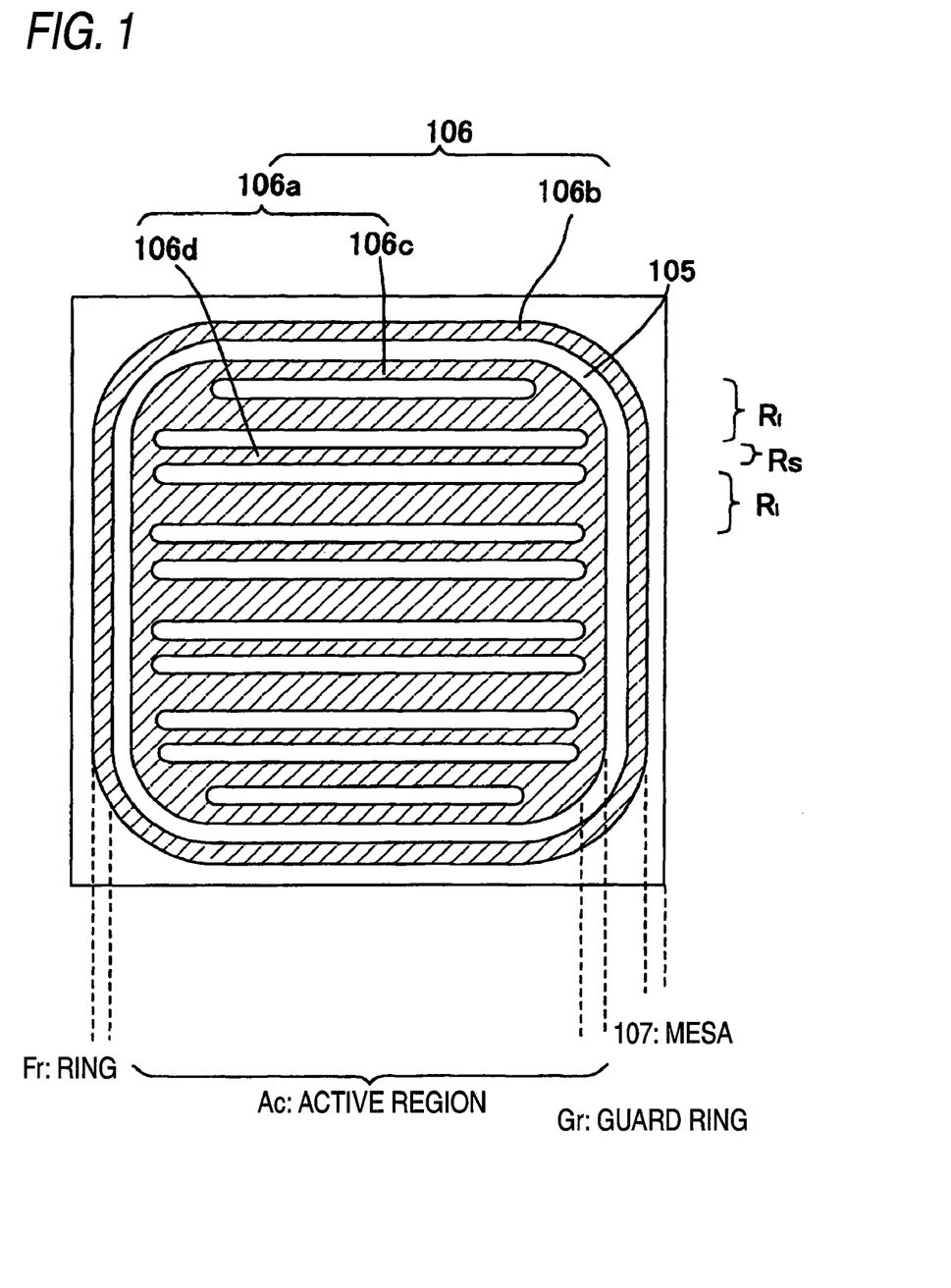
FIG. 1 is a plan view showing a mesa semiconductor device of a first embodiment of the present invention.
Figure 2:
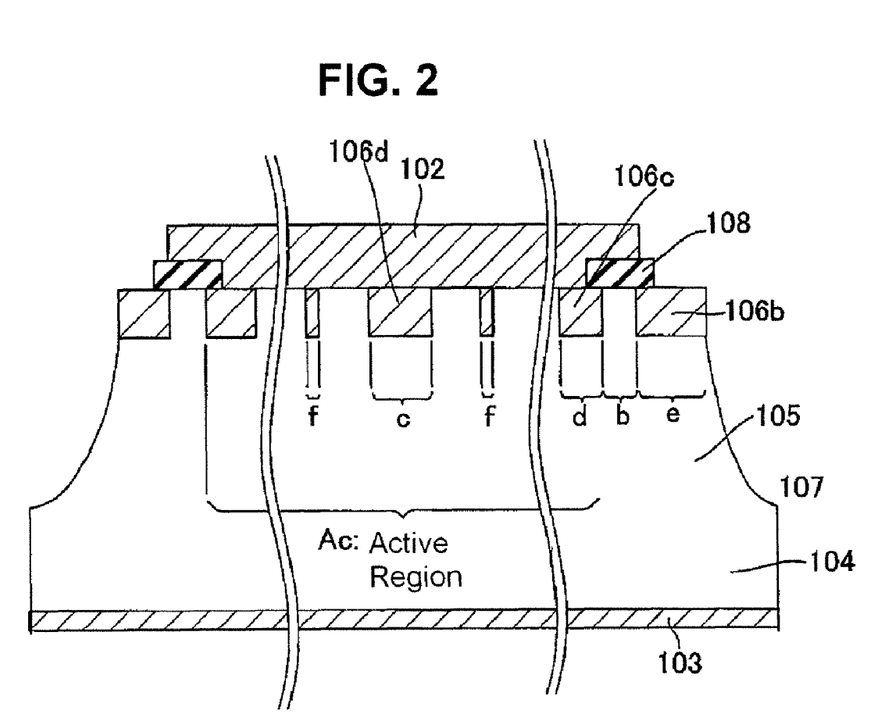
FIG. 2 is a cross-sectional view of the mesa semiconductor device.
Figure 3:
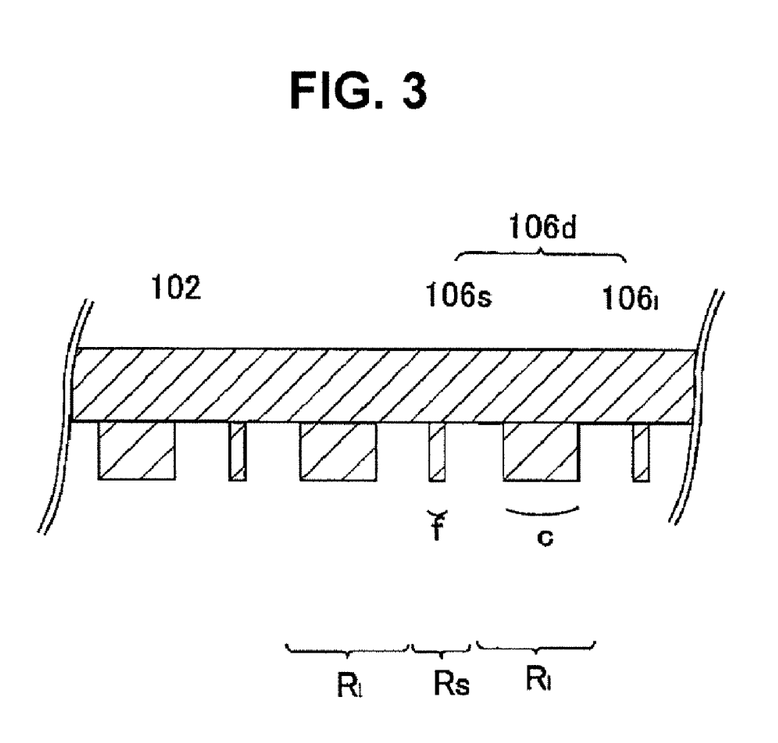
FIG. 3 is a cross-sectional view showing a characteristic portion of the mesa semiconductor device.

Embodiments of the present invention will be described in detail hereunder by reference to the drawings. In FIGS. 1 through 3, a mesa semiconductor device 100 includes an anode electrode 102 that serves as a first electrode and that is provided on one principal surface of a semiconductor substrate 101, and a cathode electrode 103 that serves as a second electrode and that is formed on the other principal surface.

FIG. 1 shows a plan view of the semiconductor device; FIG. 2 shows a cross-sectional view of the same; and FIG. 3 shows an enlarged cross-sectional view of a characteristic portion of the same. As shown in these drawings, the semiconductor device has diffused portions that are formed in a spread manner in an n⁻ layer 105 serving as a first semiconductor region and that are made of a p-type silicon layer 106 serving as a second semiconductor region. Small pitch regions Rs that are spaced at small pitches from adjacent diffused portions and large pitch regions Rl whose pitch is larger than the pitch of the small pitch region are alternately arranged in the diffused portions.

Specifically, the semiconductor device has an n-type silicon substrate 104 that serves as a semiconductor substrate and that has the n-type silicon region 105 serving as a semiconductor region of first conductivity type and provided on a first principal surface of the n-type silicon substrate 104; a p-type silicon layer 106 that extends from a surface of the n-type silicon region 105 to the inside of the n-type silicon region 105 and that serves as a semiconductor region of second conductivity type; the anode electrode 102 that is provided on the first principal surface and that serves as a first electrode; a cathode electrode 103 that is provided on a second surface opposing the first principal surface and that serves as a second electrode; and a mesa area 107 that forms a slope along an outer circumference of the n-type silicon substrate 104. The p-type silicon region 106 serving as the second semiconductor region is composed of a main region 106a that is arranged in an active area Ac on one principal surface of the silicon substrate 104 while remaining in contact with the first electrode 102 and a sub-region 106b that surrounds the main region 106a and that is arranged along an outer edge of the one principal surface of the silicon substrate 104 while remaining out of contact with the first electrode 102. The main region 106a is composed of an outer circumference annular portion 106c and diffused portions 106d arranged in a spread manner within an area surrounded by the annular portion 106c. Portions of the n-type silicon region 105 lie between the diffused portions 106d and between the diffused portions 106d and the annular portions 106c. The diffused portion 106d does not have an even pitch but is composed of small pitch regions Rs that are spaced from adjacent diffused portions 106d at a small pitch and large pitch regions Rl whose pitch is greater than the pitch of the small pitch region. A small pattern 106s for the diffused portions 106d making up the small pitch region Rs has a width of 5 μm and a pitch of 5 μm, and a large pattern 106l for the diffused portions 106d making up the large pitch region Rl has a width of 100 to 500 μm and a pitch of 5 μm.

The semiconductor substrate 101 is composed of a base layer 104 made of an n-type silicon substrate and an n-type silicon region 105 that is obtained by making a semiconductor crystal thin film, which will form an epitaxial layer, over the base layer 104. Specifically, the n-type silicon region 105 that is made of an n-type semiconductor layer identical in conductivity type with the base layer 104 and that serves as the first semiconductor region is provided over the base layer 104. The p-type silicon region 106 that differs from the n-type silicon region 105 in terms of a conductivity type and that serves as the second semiconductor region is provided in the n-type silicon region 105 by means of ion implantation and diffusion. The p-type silicon region 106 makes a p-n junction with respect to the n-type silicon region 105.

The mesa area 107 is provided along the entire outer circumference of the semiconductor substrate 101. The mesa area 107 is tilted with respect to the principal surfaces of the semiconductor substrate 101 and the p-n junction interface between the n-type semiconductor region 105 and the p-type semiconductor region 106 and extends up to the base layer 104, thereby forming a recessed, groove-shaped slope. A protective film (omitted from the drawings) is formed on the mesa area 107 so as to cover the slope, and the protective film is made of a polyimide-based resin, and the like.

The p-type silicon region 106 is made while split and separated into the main region 106a and the sub-region 106b forming a floating ring. The main region 106a is arranged in an active area of one principal surface of the semiconductor substrate 101 and remains in contact with an anode electrode 102. The sub-region 106b remains out of contact with the anode electrode 102 and forms the outer circumference of the semiconductor substrate 101. An end of the p-n junction interface between the sub-region 106b and the n-type semiconductor region 105 is exposed through the slope of the mesa area 107, and the end covers the protective film.

The main region 106a is composed of an annular portion 106c that is arranged at an outer edge of the active area along the sub-region 106b and that makes up a guard ring, and the plurality of diffused portions 106d arranged in a dispersed manner within the area surrounded by the annular portion 106c. The portions of the n-type semiconductor region 105 lie between the diffused portions 106d and between the diffused portions 106d and the annular portions 106c.

Life time killer may also be introduced into the p-type semiconductor region 106 and the n-type semiconductor region 105 by means of electron beam irradiation.

As shown in FIG. 1, in the present embodiment, the dispersed portions 106d form a stripe-like pattern but can also be arranged in a dot pattern in lieu of the stripe pattern. The n-type silicon region 105 lying between the annular portion 106c of the main region 106a and the sub-region 106b, between the diffused portions 106d, and between the diffused portions 106d and the annular portion 106c assumes a shape in which no corners are present in an interfacial boundary between the n-type silicon region 105 and the p-type silicon region 106. For instance, although both ends of the diffused portions 106d assuming the shape of a stripe are connected to the annular portion 106c, an interfacial boundary in the connection between the n-type silicon region 105 and the p-type silicon region 106 assumes a curved surface that is curved in a circular-arc shape and does not include any pointed corners.

As shown in FIG. 1, in the present embodiment, a width "d" of the annular portion 106c is greater than a width "c" of the diffused portions 106d. A distance "b" between the annular portion 106c of the main region 106a and the sub-region 106b is smaller than a distance "a" (not denoted) between the diffused regions 106d and the annular portion 106c.

The distance "b" between the annular portion 106c and the sub-region 106b of the main region 106a and specific resistance between the n-type semiconductor region 105 and the epitaxial layer forming the p-type semiconductor region 106 are set to values required to cause breakdown in the active region at the time of application of a reverse bias voltage commensurate with a preset withstand voltage value. This will be described later.

An oxide film 108, such as $SiO_2$, is made between the main region 106a and the sub-region 106b so as to cover the edge of the p-n junction interface between the n-type silicon region 105 and the p-type silicon region 106 that is exposed on one principal surface of the semiconductor substrate 101.

Effect by the foregoing configuration is now described. The p-type silicon region 106 is separated and split into the main region 106a that contacts the anode electrode 102 and the sub-region 106b that remains out of contact with the anode electrode 102. The configuration in which a portion of the n-type silicon region 105 lies between the main region 106a and the sub-region 106b of the p-type silicon region 106 yields the following working-effects.

When a reverse bias voltage is applied to the anode electrode 102, a depletion layer spreads from the main region 106a of the p-type silicon region 106 to the n-type silicon region 105, whereupon an electric field concentrates on the edge of the p-n junction interface of the main region 106a. As the reverse bias voltage increases, the depletion layer spreads from the main region 106a of the p-type silicon region 106 toward the sub-region 106b. When the depletion layer has reached the sub-region 106b, a predetermined electric potential develops in the sub-region 106b.

The predetermined electric potential is determined from the distance "b" between the annular portion 106c of the main region 106a and the sub-region 106b and an electric potential gradient in the depletion layer between the main region 106a and the sub-region 106b. The electric potential gradient is determined by the position of the anode electrode 102 spreading over the p-type silicon region 106. As a consequence, the predetermined voltage developing in the sub-region 106b becomes lower than an electric potential in the main region 106a induced by the reverse bias voltage applied to the anode electrode 102, so that the intensity of an electric field developing in the end of the p-n junction interface of the sub-region 106b; namely, the intensity of the electric field achieved in the mesa area 107, becomes smaller.

Figure 4:
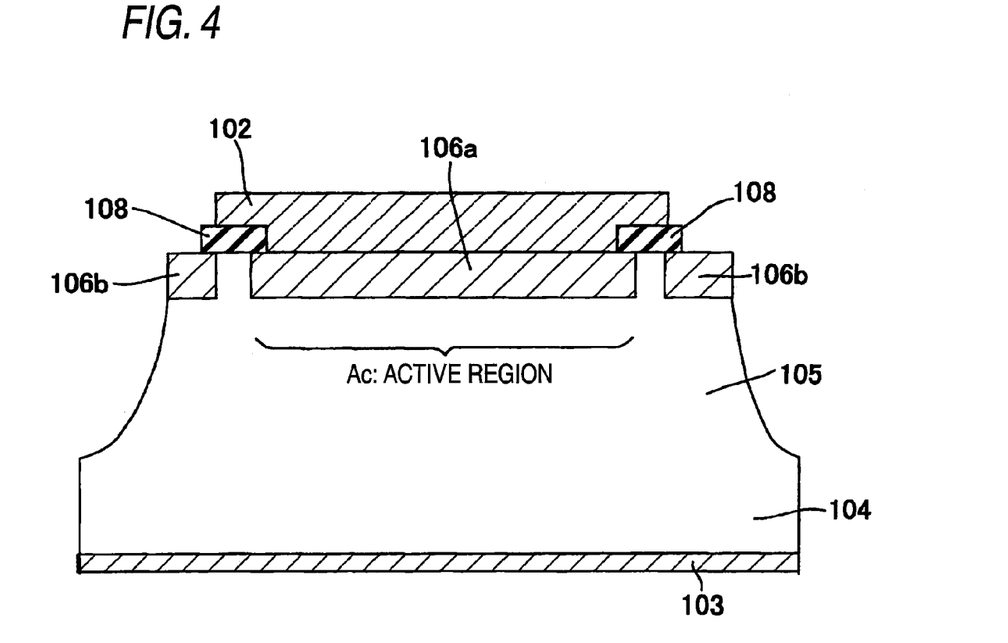
FIG. 4 is a cross-sectional view of a mesa semiconductor device of a comparative example.

Incidentally, as shown in FIG. 4 as a comparative example, when the main region 106a is present over the entire surface of the active region, the n-type silicon region 105 and the p-type silicon region 106 join each other by means of a plane surface in the entire active area. Hence, concentration of an electric field does not arrive in the active area, and concentration of an electric field arises outside the active region. Therefore, when the reverse bias voltage exceeds a predetermined value, breakdown occurs in the main region 106a forming an active region.

However, the main region 106a is composed of the annular portion 106c and the diffused portions 106d arranged in a spread manner in the area surrounded by the annular portion 106c, whereby at the time of application of the reverse bias voltage an electric field concentrates on the diffused regions 106d located much inside as compared with the annular portion 106c.

Consequently, the withstand voltage of the active region becomes lower in the diffused regions 106d than in the annular portion 106c, and the device reliably induces breakdown, by means of the reverse bias voltage, in the active region surrounded by the annular portion 106c of the main region 106a. Local destruction, which would otherwise be caused by local concentration of an electric field on the annular portion 106c, can be prevented, and withstand capacity for static breakdown due to ESD is enhanced.

Therefore, the p-type silicon region 106 is separated and split into the main region 106a that contacts the anode electrode 102 and the sub-region 106b that remains out of contact with the anode electrode 102. The main region 106e is composed of the annular portion 106c and the diffused portions 106d arranged in a spread manner in the interior area surrounded by the annular portion 106c. Thus, there can be implemented a highly-reliable device that enhances a withstand voltage and that reliably causes breakdown in the diffused portions 106d of the active region by means of the reverse bias voltage.

Incidentally, as shown in FIG. 2, when the distance "b" between the main region 106a and the sub-region 106b falls within the range of a predetermined value (allowance), a breakdown voltage at which breakdown arises in the active region is constant regardless of the distance "b" between the main region 106a and the sub-region 106b. However, when the distance "b" between the main region 106a and the sub-region 106b exceeds the predetermined value (allowance), breakdown arises in the annular portion 106c of the main region 106a; particularly, in corners. As shown in FIG. 10, in general, as the thickness of an "n" layer between a $p^+$-layer and an $n^+$-layer increase, the breakdown voltage is known to increase. As the concentration of impurities in each layer thickness increases to a given level or more, the breakdown voltage is known to decrease.

In order to acquire a sufficient forward voltage, an area making up a Schottky junction; namely, a contact area between an n-type silicon region and a first electrode 102, must be maintained so as to come to a desired area. Accordingly, the width of the n-type silicon region; namely, a pitch between p-type silicon regions, is fixed, to thus provide the width of the p-type silicon region with a double pitch. Thus, there is obtained a structure having both a pitch at which breakdown arises in the active region and a pitch at which the Schottky junction area is maintained.

Therefore, the width "d" of the p-type silicon region in the large pitch region is first determined. In the small pitch region, the distance "b" between the main region 106a and the sub-region 106b and the specific resistance of the n-type silicon region 105 serving as an epitaxial layer are set to values required to cause breakdown in the active region at the time of application of a reverse bias voltage commensurate with a preset withstand voltage value. For instance, when the distance "b" between the main region 106a and the sub-region 106b is determined by design, the specific resistance of the epitaxial layer is selectively set in such a way that breakdown arises in the active region at determined distance "b," Alternatively, when the specific resistance of the epitaxial layer is determined by design, the distance "b" between the main region 106a and the sub-region 106b is selectively determined in such a way that breakdown arises in the active region at determined specific resistance.

Example 1

First, a Schottky junction area is determined from a required forward voltage in FIG. 1, and the width "d" of the p-type silicon region of the large pitch region is determined. In the small pitch region, the distance "a" between the diffused portions 106d and the annular portion 106c is set to 8 μm; the width "c" of the diffused portions 106d is set to 12 μm; the width "d" of the annular portion 106c is set to 25 μm; the width "e" of the sub-region 106b is set to 30 μm; and the distance "b" between the annular portion 106c and the sub-region 106b is made variable.

Figure 5:
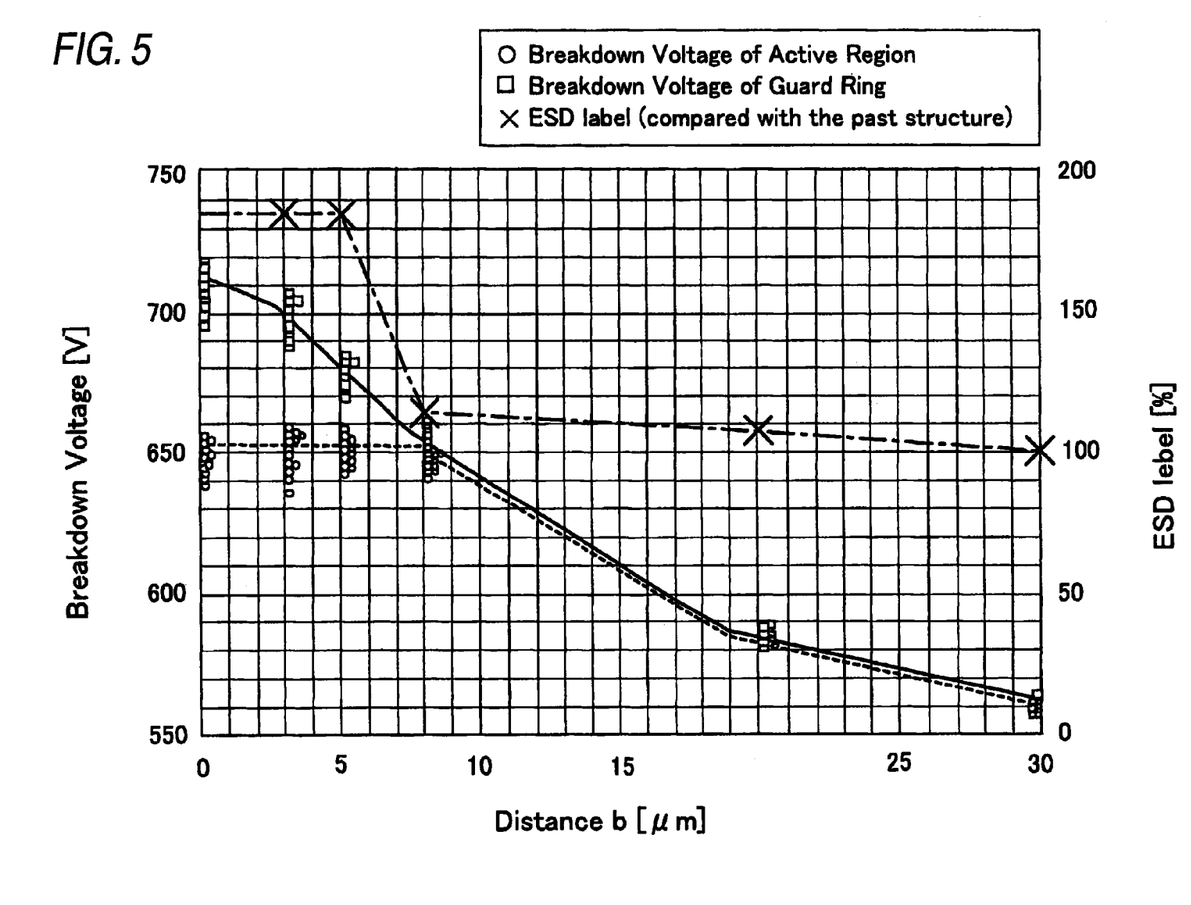
FIG. 5 is a view showing a withstand voltage dependence of an active region and a withstand voltage dependence of an annular portion, and dependence of an ESD level.

FIG. 5 shows withstand voltage dependence of the active region, withstand voltage dependence of the annular portion 106c, and dependence of the ESD level achieved in this case.

In FIG. 5, what is denoted by a locus "a" is a result of a withstand voltage test acquired when the distance "b" is changed in the structure having the diffused portions 106d in the active region shown in FIG. 2. What is denoted by a locus "b" is a result of a withstand voltage test acquired when the distance "b" is changed in the structure where the main region 106a is present in the entire surface of the active region shown in FIG. 4. What is denoted by a locus "c" is a test result acquired by comparison of an ESD level at which static breakdown arises when the distance "b" is changed in the structure having the diffused portions 106d in the active region shown in FIG. 1 with an ESD level acquired when the distance "b" is set to 30 μm.

As shown in FIG. 4, when the main region 106a is present in the entire surface of the active region, a breakdown voltage decreases while following the distance "b" shown in FIG. 4 as indicated by the locus "b" shown in FIG. 5. The reason for this is that the intensity of an electric field developing in the corners of the annular portion 106c of the main region 106a increases with an increase in distance "b" and shows that breakdown occurs in the annular portion 106c of the main region 106a regardless of the distance "b."

Figure 6:
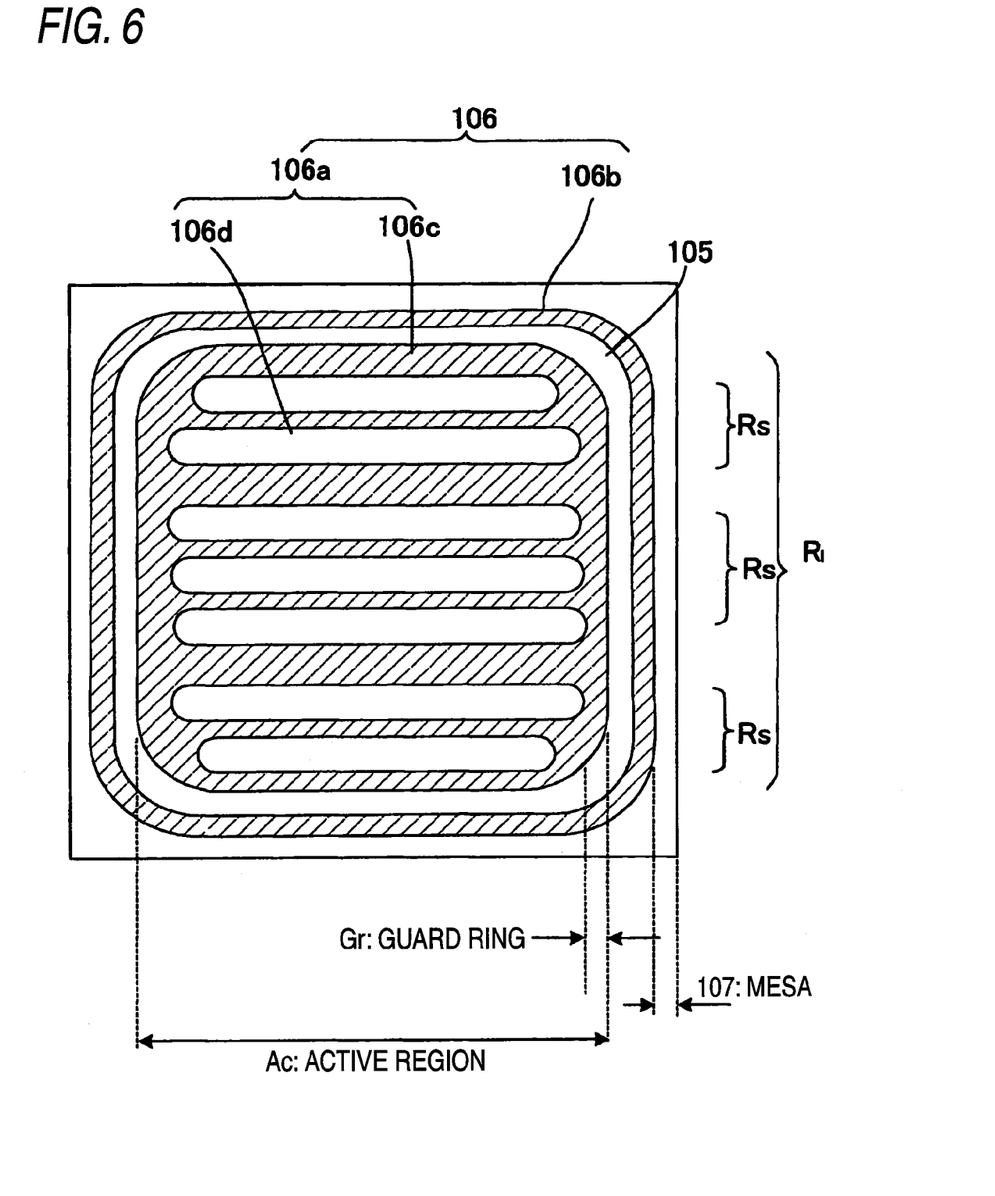
FIG. 6 is a plan view showing a mesa semiconductor device of a second embodiment of the present invention.

When the diffused portions 106d are present in the active region shown in FIG. 2, the breakdown voltage remains constant until the distance "b" assumes a value of 8 μm as indicated by the locus "a" shown in FIG. 6. When the distance "b" comes to 8 μm or more, the breakdown voltage decreases while following the distance "b."

Therefore, when the active region has the diffused portions 106d, the withstand voltage of the annular portion 106c is higher than the withstand voltage of the diffused portions 106d of the active region until the distance "b" comes to 8 μm. When the distance "b" exceeds 8 μm, the relationship between the withstand voltage of the annular portion 106c and the withstand voltage of the diffused portions 106d of the active region is inverted. It is understood that the withstand voltage of the entire semiconductor device is decreased in terms of a relative ratio and that the withstand voltage of the annular portion 106c becomes dominant.

This shows the followings. Specifically, the withstand voltage of the diffused portions 106d of the active region determines the withstand voltage of an element serving as a device regardless of the distance "b" until the distance "b" comes to 8 μm. Breakdown occurs in the diffused portions 106d of the active region within this range of distance. When the distance "b" comes to 8 μm or more, the withstand voltage of the annular portion 106c determines the element withstand voltage of the device, whereby breakdown occurs in the annular portion 106c of the main region 106a.

As indicated by the locus "c" shown in FIG. 5, when the ESD level at which static breakdown occurs at a distance "b" of 30 μm is taken as a reference level of 100%. When the distance "b" comes to 8 μm or less, the ESD level at which static breakdown occurs is increased. When the distance "b" is 5 μm, the ESD level comes to 180%, and the ESD level is improved by about 80%.

Therefore, in the present invention, the active region is divided into the large pitch region and the small pitch region and designed in such a way that the Schottky junction area is sufficiently maintained in the large pitch region and that the withstand voltage of the small pitch region becomes lower than the withstand voltage of the annular portion 106c. Thus, the active region is divided into the large pitch region and the small pitch region, whereby the withstand voltage of the diffused portions 106d of the active region can be readily designed so as to become lower than the withstand voltage of the annular portion 106c while the Schottky junction area is maintained. Accordingly, highest concentration of an electric field develops in the active region during application of a reverse bias voltage, thereby preventing local concentration of an electric field on the annular portion 106c. As a consequence, an attempt can be made to enhance an ESD level that brings about static breakdown.

FIG. 5 shows results of tests performed when the specific resistance of the epitaxial layer is set to 20 Ωcm and the thickness of the epitaxial layer is set to 50 μm. However, when the same tests were conducted while the specific resistance of the epitaxial layer was set to 30 Ωcm and 40 Ωcm and while the thickness of the epitaxial layer was set to 50 μm, results similar to those shown in FIG. 5 could not be acquired. In this case, when the distance "b" ranged from 0 μm to 30 μm, the withstand voltage of the diffused portions 106d of the active region in the structure having the diffused portions 106d in the active region became greater than the withstand voltage of the annular portion 106c in the structure where the main region 106a was present in the entire surface of the active region. Consequently, as compared with the case where the specific resistance of the epitaxial layer is 20 Ωcm, an attempt could not be made to enhance the ESD level that brings about static breakdown in the case where the specific resistance of the epitaxial layer was 30 Ωcm or 40 Ωcm.

Specifically, when a device is designed, it is necessary to satisfy a design withstand voltage; to determine a material for an epitaxial layer having specific resistance by means of which a relationship between the withstand voltage of the diffused portions 106d of the active region and the withstand voltage of the annular portion 106c fulfills the relationship shown in FIG. 5; and to determine the width "e" of the sub-region 106b, the width "d" of the annular portion 106c, the width "c" of the diffused portions 106d, the distance "b" between the annular portion 106c of the main region 106a and the sub-region 106b, and the distance "a" between the diffused portions 106d and the annular portion 106c.

Desirable relationships are c>b and a>d>f.

The breakdown withstand voltage can be determined in a chip (an active region) by fulfilling a relationship c>b.

In contrast, when a relationship comes to c<b, concentration of an electric field occurs in the guard ring.

Further, in order to lessen a curvature of the width "d" of the annular portion 106c as compared with the curvature radius of the width "f" of a narrow portion of the internal stripe, a relationship d>f must be fulfilled. In the meantime, since there stands a relationship of a>f, a>d>f is fulfilled.

In order to acquire the relationship, the specific resistance of the epitaxial layer is preferably low, and a tradeoff between the specific resistance and the design withstand voltage becomes important.

Second Embodiment

A second embodiment of the present invention is now described.

Figure 7:
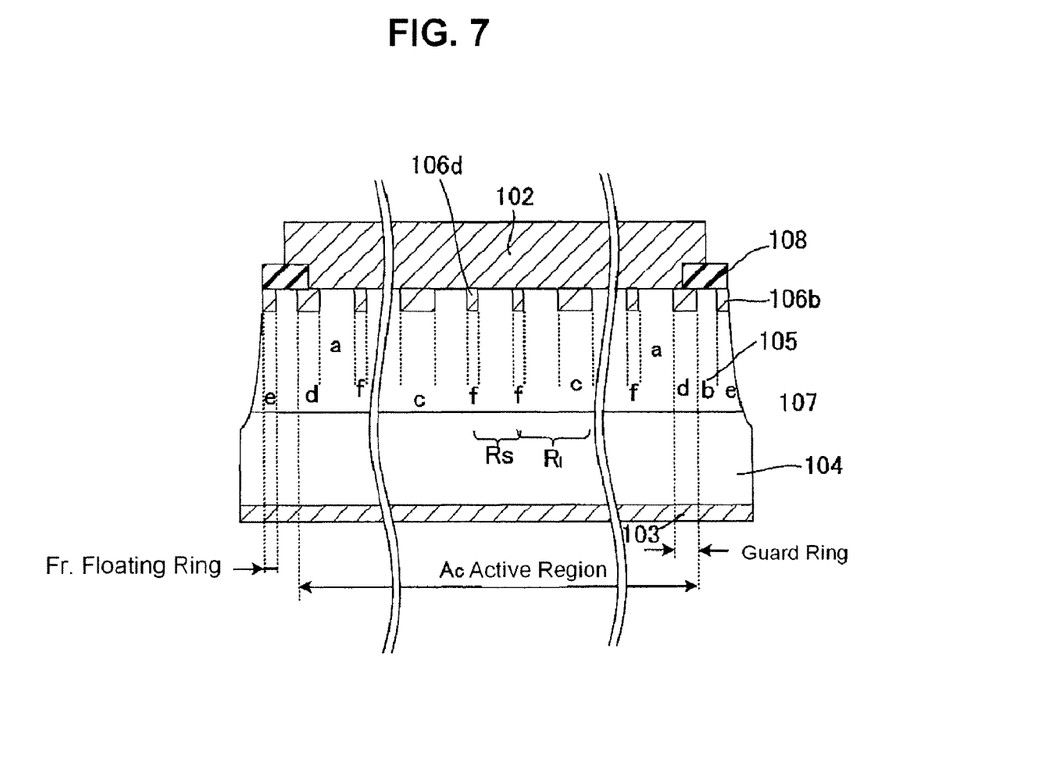
FIG. 7 is a cross-sectional view of the mesa semiconductor device.

As shown in a plan view of FIG. 6 and a cross-sectional view of FIG. 7, a present semiconductor device includes the n$^-$ layer 105 serving as the first semiconductor region and the diffused portions 106b that are made in the n$^-$ layer 105 in a spread manner and that is made from the p-type silicon layer 106 serving as the second semiconductor region, wherein the diffused portions 106b include the small pitch regions Rs that have a smaller pitch and that are made in the large pitch regions Rl spaced from adjacent diffused portions at a large pitch.

The present embodiment is similar to the first embodiment in terms of the other of the configuration. Even at the time of layout design, it is better to determine an area of a p-type silicon region required to maintain the Schottky junction area in the same manner as in the first embodiment and to determine a layout of small pitch regions after a pattern for the large pitch regions has been determined. A withstand voltage is determined by a line pitch of the diffused portions in the small pitch region.

Third Embodiment

A third embodiment of the present invention will now be described.

Figure 8:
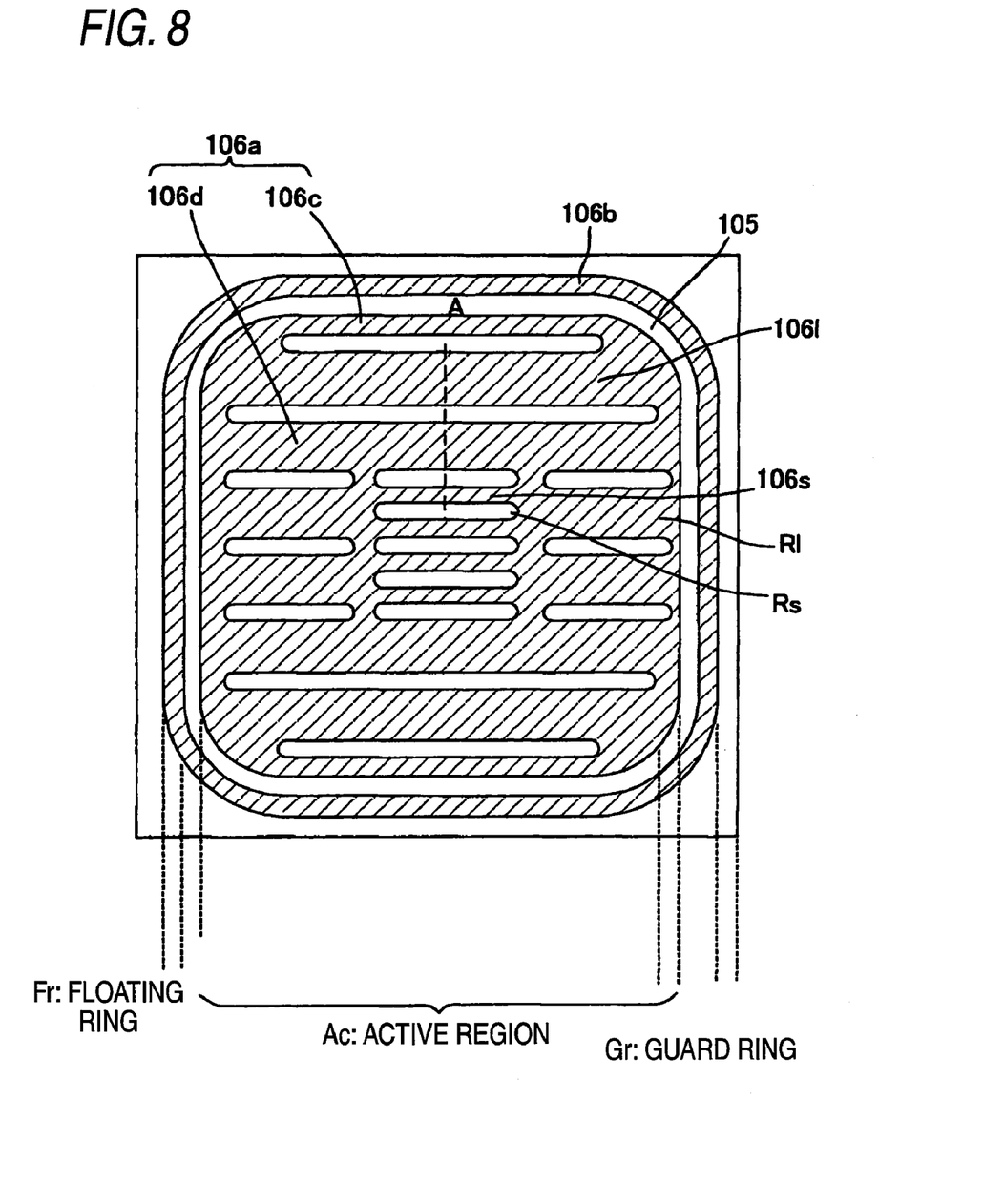
FIG. 8 is a plan view of a mesa semiconductor device of a third embodiment of the present invention.
Figure 9:
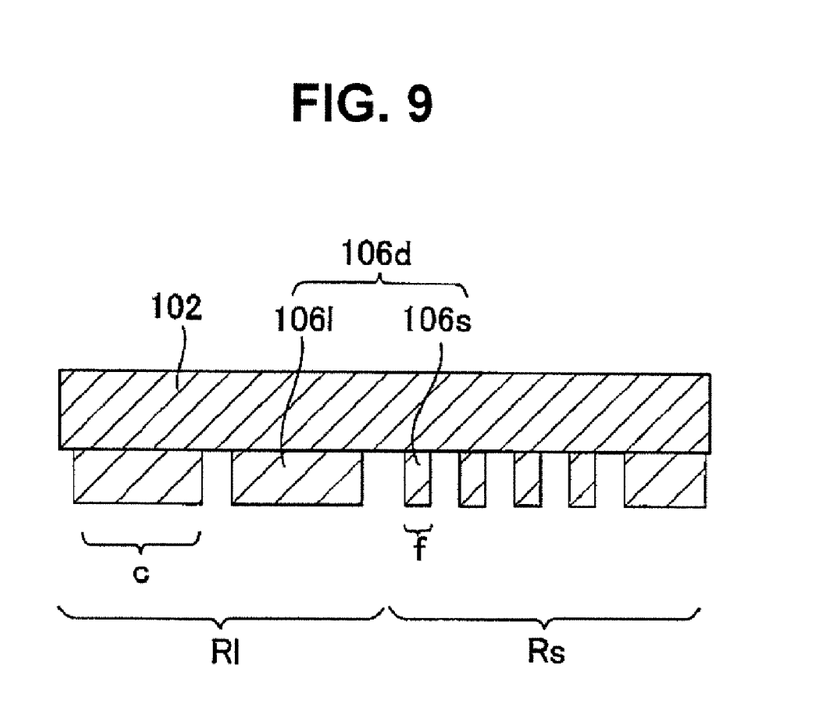
FIG. 9 is a cross-sectional view showing a characteristic portion of the mesa semiconductor device.

As shown in a plan view of FIG. 8, a cross-sectional view of FIG. 9, and an enlarged cross-sectional view of a characteristic portion of FIG. 10, a present semiconductor device includes the n$^-$ layer 105 serving as the first semiconductor region and the diffused portions 106b that are made in the n$^-$ layer 105 in a spread manner and that is made from the p-type silicon layer 106 serving as the second semiconductor region, wherein the diffused portions 106b is composed of the small pitch regions Rs spaced apart from adjacent diffused portions at a small pitch and the large pitch regions Rl whose pitch is larger than the pitch of the small pitch regions; and wherein the small pitch regions Rs are made in the large pitch regions Rl. In contrast with a case where the large pitch regions Rl and the small pitch regions Rs are alternately provided in the first embodiment, the small pitch regions Rs are made in the large pitch regions Rl in the present embodiment.

The present embodiment is similar to the first embodiment in terms of the other of the configuration. Further, even at the time of layout design, it is better to determine an area of a p-type silicon region required to maintain the Schottky junction area in the same manner as in the first embodiment and to determine a layout of small pitch regions after a pattern for the large pitch regions has been determined. A withstand voltage is determined by a line pitch of the diffused portions in the small pitch region.

In the present invention, an attempt can be made to enhance withstand capacity for static breakdown due to ESD, which is effective for a high withstand voltage mesa semiconductor device.

What is claimed is:

1. A semiconductor device, comprising:
   a semiconductor substrate having a first semiconductor region of a first semiconductor type, a second semiconductor region of a second conductivity type extended in the first semiconductor region, and a mesa area forming a slope along an outer circumference of the semiconductor substrate;
   a first electrode provided on a first principal surface of the semiconductor substrate; and
   a second electrode provided on a second principal surface of the semiconductor substrate that is opposed to the first principal surface;
   wherein the second semiconductor region comprises:
      a main region provided in the semiconductor substrate while being brought into contact with the first electrode, the main region including an annular portion and diffused portions arranged in a spread manner in an area surrounded by the annular portion; and
   wherein a portion of the first semiconductor region is interposed between the diffused portions and between the diffused portions and the annular portion; and the diffused portions are composed of a small pitch region and a large pitch region having a larger pitch than that of the small pitch region,
   wherein the diffused portions include at least two small pitch regions, and the large pitch region is interposed between two small pitch regions.

2. The semiconductor device according to claim 1, wherein the second semiconductor region comprises a sub-region provided so as to surround the main region while not being brought into contact with the first electrode.

3. The semiconductor device according to claim 1, wherein the small pitch region and the large pitch region are alternately provided.

4. The semiconductor device according to claim 1, wherein the diffused portions are composed of a stripe-like pattern.

5. The semiconductor device according to claim 1, wherein the small pitch region is arranged in the large pitch region.

6. The semiconductor device according to claim 5, wherein the diffused portions are composed of a stripe-like pattern, and the small pitch region composed of a small-pitch stripe-like pattern is arranged in the large pitch region composed of a large-pitch stripe-like pattern.

7. The semiconductor device according to claim 1, wherein the small pitch region and the large pitch region are alternately provided in a direction which intersects the annular portion.

8. The semiconductor device according to claim 1, wherein the annular portion completely surrounds the diffused portions.

* * * * *